(12) United States Patent
Abiko et al.

(10) Patent No.: US 10,825,490 B2
(45) Date of Patent: Nov. 3, 2020

(54) SEMICONDUCTOR STORAGE DEVICE

(71) Applicant: TOSHIBA MEMORY CORPORATION, Minato-ku, Tokyo (JP)

(72) Inventors: Naofumi Abiko, Kawasaki Kanagawa (JP); Masahiro Yoshihara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/556,044

(22) Filed: Aug. 29, 2019

(65) Prior Publication Data

US 2020/0286532 A1 Sep. 10, 2020

(30) Foreign Application Priority Data

Mar. 8, 2019 (JP) ................. 2019-042716

(51) Int. Cl.

| | |
|---|---|
| G11C 16/26 | (2006.01) |
| G11C 7/08 | (2006.01) |
| G11C 7/10 | (2006.01) |
| G11C 16/08 | (2006.01) |
| G11C 16/30 | (2006.01) |
| G11C 16/24 | (2006.01) |
| G11C 16/10 | (2006.01) |

(52) U.S. Cl.
CPC .............. *G11C 7/08* (2013.01); *G11C 7/1063* (2013.01); *G11C 16/08* (2013.01); *G11C 16/10* (2013.01); *G11C 16/24* (2013.01); *G11C 16/26* (2013.01); *G11C 16/30* (2013.01)

(58) Field of Classification Search
CPC ........................................ G11C 16/26
USPC ........................................ 365/185.21, 185.18
See application file for complete search history.

(56) References Cited

U.S. PATENT DOCUMENTS

| | | | |
|---|---|---|---|
| 9,672,927 B2 * | 6/2017 | Maejima ................. | G11C 16/26 |
| 10,204,692 B1 * | 2/2019 | Kamata .............. | G11C 16/0483 |
| 10,210,924 B2 | 2/2019 | Kamata | |
| 2014/0133230 A1 | 5/2014 | Kamei et al. | |

FOREIGN PATENT DOCUMENTS

JP 2018-120648 A 8/2018

* cited by examiner

*Primary Examiner* — Son L Mai

(74) *Attorney, Agent, or Firm* — Foley & Lardner LLP

(57) ABSTRACT

According to one embodiment, a semiconductor storage device includes a memory cell and a memory cell connected to a word line, a first bit line BL connected to the memory cell, a second bit line BL connected to the memory cell, and a control circuit. The control circuit includes a first transistor provided between the first bit line and the node and including one end electrically connected to the node, and a second transistor provided between the second bit line and the node and including one end electrically connected to the node; the second transistor is provided adjacent to the first transistor; and the control circuit is configured to set one of the first transistor and the second transistor in an ON state while setting the other in an OFF state.

14 Claims, 12 Drawing Sheets

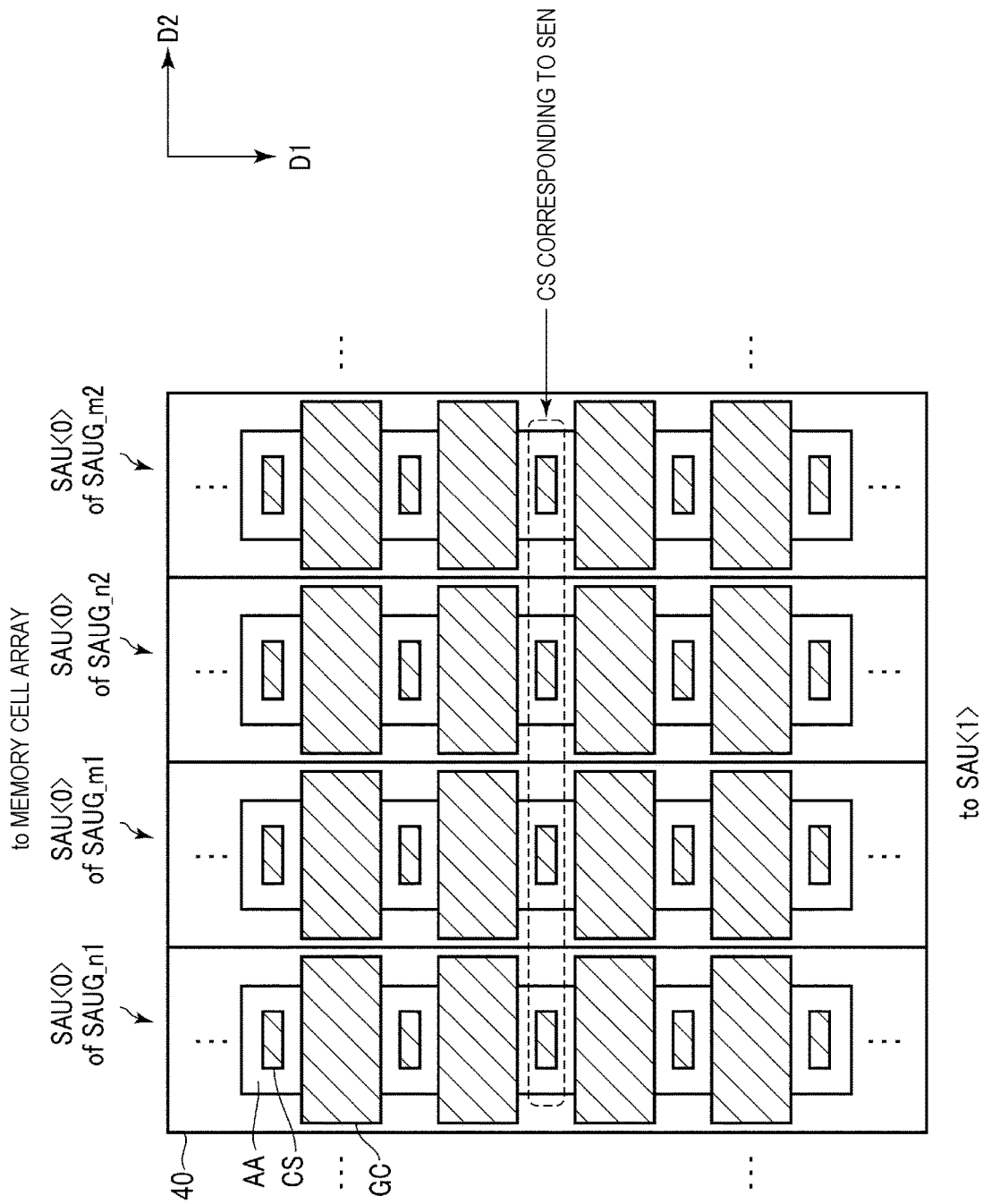

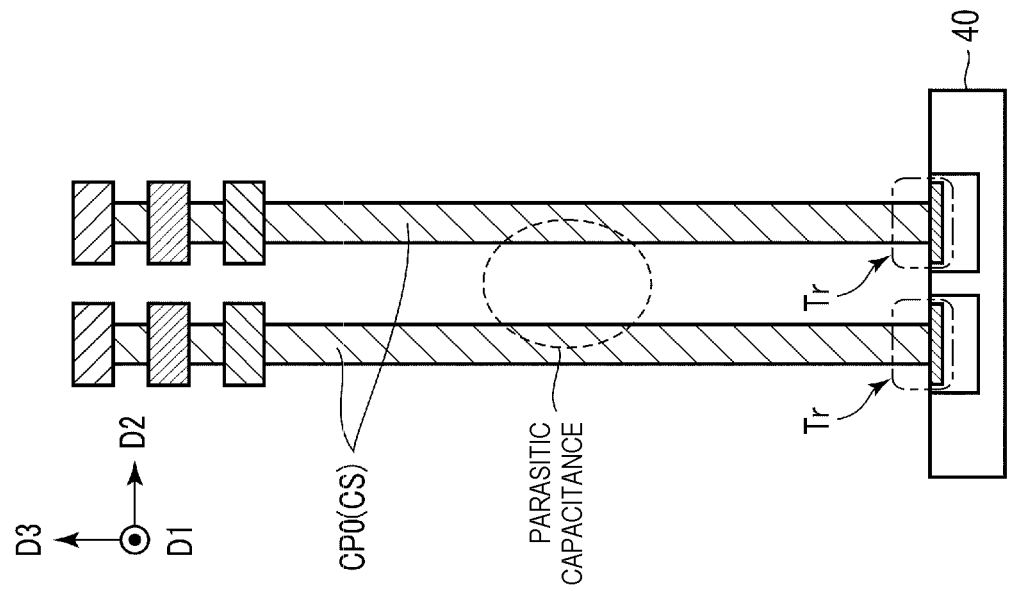
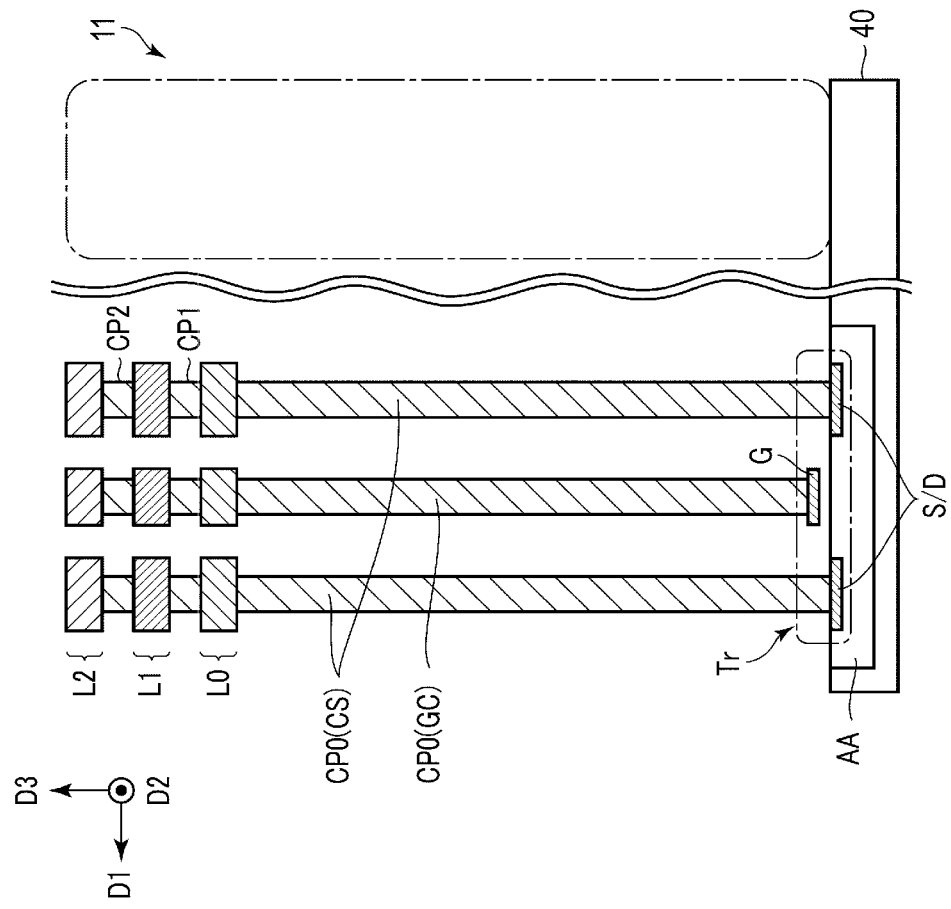

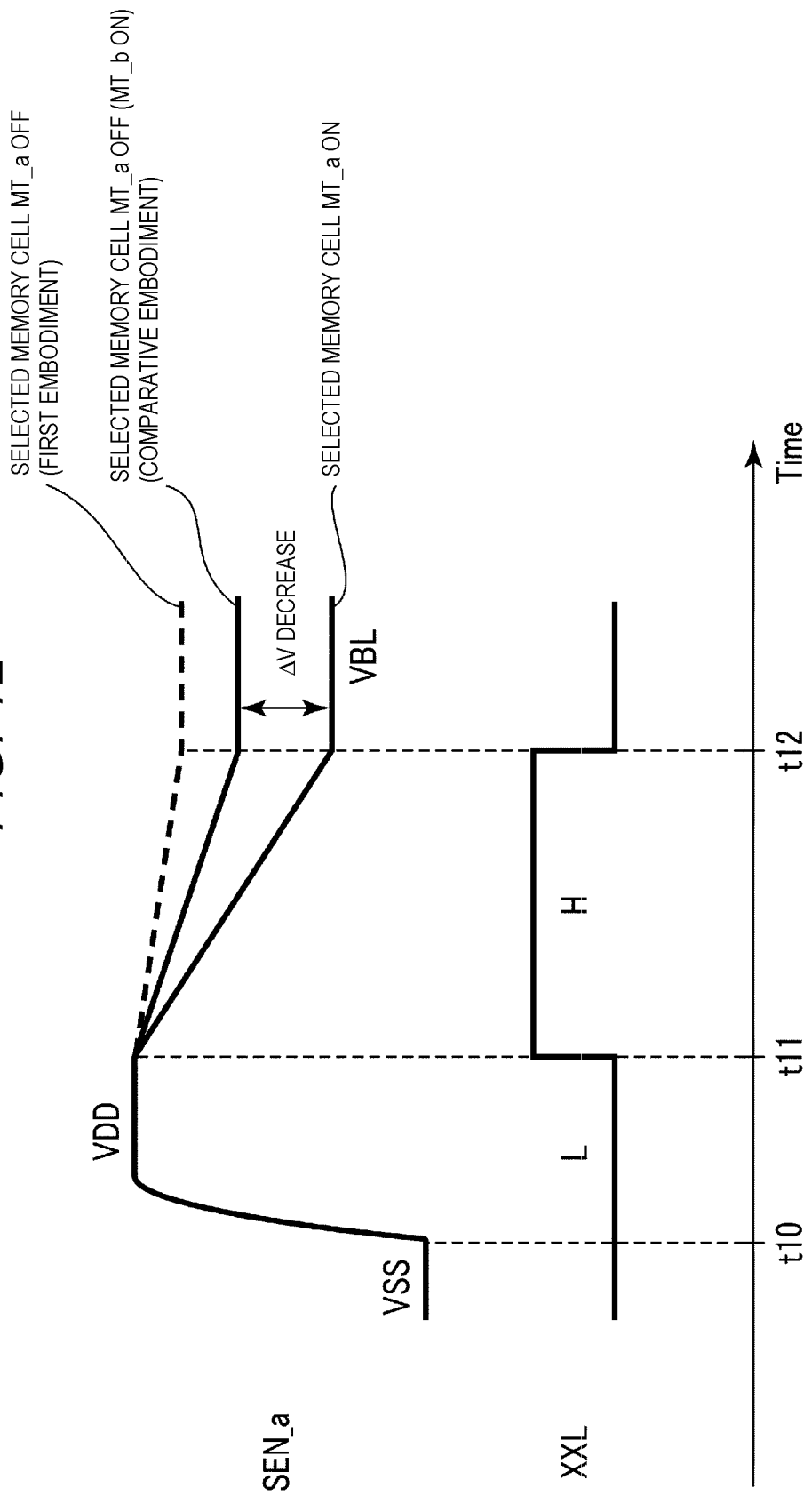

SEMICONDUCTOR STORAGE DEVICE

CROSS-REFERENCE TO RELATED APPLICATION(S)

This application is based upon and claims the benefit of priority from Japanese Patent Application No. 2019-042716, filed Mar. 8, 2019, the entire contents of which are incorporated herein by reference.

FIELD

Embodiments described herein relate generally to a semiconductor storage device.

BACKGROUND

A NAND flash memory is known as a semiconductor storage device.

Examples of related art include JP-A-2018-120648.

DESCRIPTION OF THE DRAWINGS

FIG. 9 is a diagram showing an example of a layout of a sense amplifier unit in the semiconductor storage device according to the first embodiment and a transistor in the sense amplifier unit.

FIG. 10A and FIG. 10B are diagrams showing an example of a part of a cross-sectional structure of the semiconductor storage device according to the first embodiment.

FIG. 12 is a timing chart showing an example of a temporal change of a voltage that is applied to various circuit components according to a certain sense amplifier unit and is used in a read operation in the semiconductor storage device according to a comparative embodiment.

DETAILED DESCRIPTION

Figure 1:
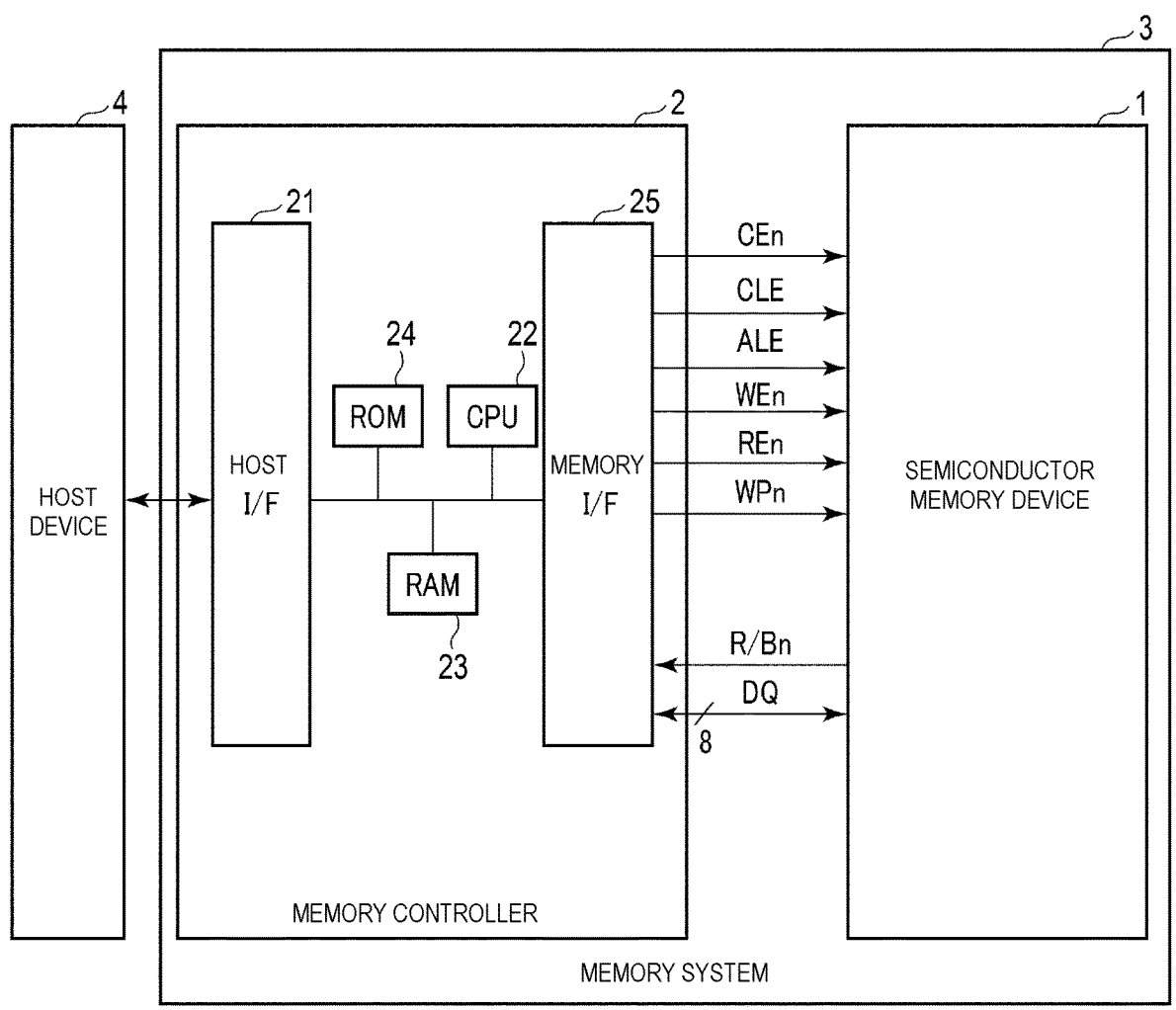
FIG. 1 is a block diagram showing an example of a configuration of a memory system including the semiconductor storage device according to a first embodiment.

Embodiments provide a high-quality semiconductor storage device.

In general, according to one embodiment, a semiconductor storage device includes a first memory cell and a second memory cell connected to a first word line, a first bit line connected to the first memory cell, a second bit line connected to the second memory cell, and a control circuit. The control circuit includes a first node and a second node, a first transistor provided between the first bit line and the first node and including one end electrically connected to the first node, and a second transistor provided between the second bit line and the second node and including one end electrically connected to the second node; the second transistor is provided adjacent to the first transistor; and the control circuit is configured to electrically connect the first node to the first bit line by setting the first transistor in an ON state while setting the second transistor in an OFF state and sense the first node after being electrically connected to the first bit line, and electrically connect the second node to the second bit line by setting the second transistor in an ON state while setting the first transistor in an OFF state and sense the second node after being electrically connected to the second bit line.

Hereinafter, embodiments will be described with reference to the drawings. In the following description, components having the same function and configuration are denoted by the same reference numerals. Further, when a plurality of components having a common reference numeral are distinguished, the common reference numeral is added with a subscript to distinguish them from each other. When the plurality of components do not need to be particularly distinguished, only the common reference numerals are added to the plurality of components, with the subscript not being added.

First Embodiment

A semiconductor storage device 1 according to a first embodiment will be described below.

Configuration Example (1) Memory System

FIG. 1 is a block diagram showing an example of a configuration of a memory system 3 including the semiconductor storage device 1 according to the first embodiment.

As shown in FIG. 1, the memory system 3 includes the semiconductor storage device 1 and a memory controller 2, and is controlled by a host device 4. The memory system 3 is, for example, a solid state drive (SSD) or a SD™ card.

The semiconductor storage device 1 is controlled by the memory controller 2. The memory controller 2 receives an instruction from the host device 4 and controls the semiconductor storage device 1 based on the received instruction.

The memory controller 2 includes a host interface unit 21, a central processing unit (CPU) 22, a random access memory (RAM) 23, a read only memory (ROM) 24, and a memory interface unit 25. The memory controller 2 is configured as, for example, a System-on-a-chip (SoC).

The ROM 24 stores firmware (program). The RAM 23 is capable of storing the firmware and is used as a work region of the CPU 22. The RAM 23 further temporarily stores data and functions as a buffer and a cache. The firmware stored in the ROM 24 and loaded onto the RAM 23 is executed by the CPU 22. Thus, the memory controller 2 executes various operations including a write operation and a read operation to be described later, and a part of the functions of the host interface unit 21 and the memory interface unit 25.

The host interface unit 21 is connected to the host device 4 via a bus, and controls communication between the memory controller 2 and the host device 4. The memory interface unit 25 is connected to the semiconductor storage device 1 via a memory bus, and controls communication between the memory controller 2 and the semiconductor storage device 1. The memory bus transmits, for example, a chip enable signal CEn, a command latch enable signal CLE, an address latch enable signal ALE, a write enable signal WEn, a read enable signal REn, a write protect signal WPn, a ready/busy signal R/Bn, and a signal DQ.

(2) Semiconductor Storage Device

Figure 2:
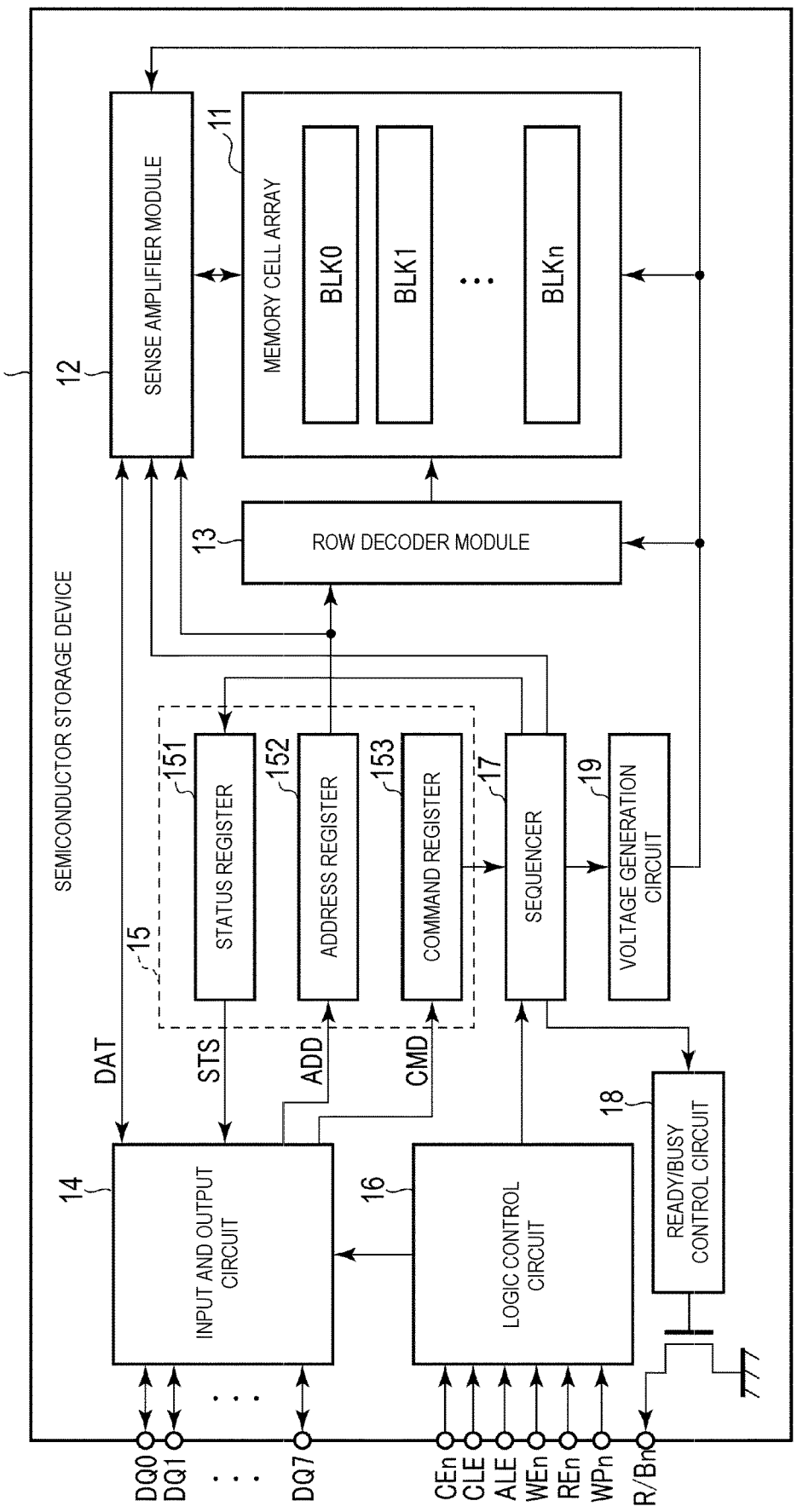
FIG. 2 is a block diagram showing an example of a configuration of the semiconductor storage device according to the first embodiment.

FIG. 2 is a block diagram showing an example of the configuration of the semiconductor storage device 1 according to the first embodiment. The semiconductor storage device 1 according to the first embodiment is, for example, a NAND flash memory capable of storing data in a nonvolatile manner.

As shown in FIG. 2, the semiconductor storage device 1 includes a memory cell array 11, a sense amplifier module 12, a row decoder module 13, an input and output circuit 14, a register 15, a logic control circuit 16, a sequencer 17, a ready/busy control circuit 18, and a voltage generation circuit 19. The semiconductor storage device 1 executes various operations such as a write operation of storing write data DAT in the memory cell array 11 and a read operation of reading read data DAT from the memory cell array 11.

The memory cell array 11 includes blocks BLK0 to BLKn (n is an integer of 1 or more). The block BLK includes a plurality of nonvolatile memory cells associated with bit lines and word lines, and is, for example, an erase unit of data. In the semiconductor storage device 1, for example, a Single-Level Cell (SLC) system or a Multi-Level Cell (MLC) system may be applied. In the SLC system, 1-bit data is stored in each memory cell; and in the MLC system, 2 or more-bit data is stored in each memory cell.

The input and output circuit 14 controls input and output of a signal DQ to and from the memory controller 2. The signal DQ includes a command CMD, data DAT, address information ADD, and status information STS, and the like. The command CMD includes, for example, an instruction for executing an instruction from the host device 4. The data DAT includes write data DAT or read data DAT. The address information ADD includes, for example, a column address and a row address. The status information STS includes, for example, information related to the status of the semiconductor storage device 1 related to the write operation and the read operation.

More specifically, the input and output circuit 14 includes an input circuit and an output circuit, and the input circuit and the output circuit perform the following processing. The input circuit receives the write data DAT, the address information ADD, and the command CMD from the memory controller 2. The input circuit transfers the received write data DAT to the sense amplifier module 12, and transfers the received address information ADD and command CMD to the register 15. The output circuit receives the status information STS from the register 15 and receives the read data DAT from the sense amplifier module 12. The output circuit transmits the received status information STS and read data DAT to the memory controller 2. Here, the input and output circuit 14 and the sense amplifier module 12 are connected via a data bus. The data bus includes, for example, eight data lines 100 to 107 corresponding to the signals DQ0 to DQ7. The number of the data lines IO is not limited to eight, and may be, for example, 16 or 32, and may be set freely.

The register 15 includes a status register 151, an address register 152, and a command register 153.

The status register 151 stores the status information STS, and transfers the status information STS to the input and output circuit 14 based on an instruction from the sequencer 17.

The address register 152 stores address information ADD transferred from the input and output circuit 14. The address register 152 transfers a column address in the address information ADD to the sense amplifier module 12, and transfers a row address in the address information ADD to the row decoder module 13.

The command register 153 stores the command CMD transferred from the input and output circuit 14, and transfers the command CMD to the sequencer 17.

The logic control circuit 16 receives, for example, a chip enable signal CEn, a command latch enable signal CLE, an address latch enable signal ALE, a write enable signal WEn, a read enable signal REn, and a write protect signal WPn from the memory controller 2. The logic control circuit controls the input and output circuit 14 and the sequencer 17 based on the received signal.

The chip enable signal CEn is a signal used to enable the semiconductor storage device 1. The command latch enable signal CLE is a signal used to notify the input and output circuit 14 that the signal DQ input to the semiconductor storage device 1 is the command CMD. The address latch enable signal ALE is a signal used to notify the input and output circuit 14 that the signal DQ input to the semiconductor storage device 1 is the address information ADD. The write enable signal WEn and the read enable signal REn are, for example, signals respectively used for instructing the input and output of the signal DQ to the input and output circuit 14. The write protect signal WPn is a signal used to instruct the semiconductor storage device 1 to inhibit write and erase of the data.

The sequencer 17 controls the entire operation of the semiconductor storage device 1 based on the command CMD stored in the command register 153. For example, the sequencer 17 controls the sense amplifier module 12, the row decoder module 13, the voltage generation circuit 19, and the like to execute various operations such as the write operation and the read operation.

The ready/busy control circuit 18 generates a ready/busy signal R/Bn under the control of the sequencer 17, and transmits the generated ready/busy signal R/Bn to the memory controller 2. The ready/busy signal R/Bn is a signal used to notify whether the semiconductor storage device 1 is in a ready state in which an instruction from the memory controller 2 is received or a busy state in which an instruction is not received.

The voltage generation circuit 19 generates various voltages based on control by the sequencer 17, and supplies the generated voltages to the memory cell array 11, the sense amplifier module 12, the row decoder module 13, and the like. For example, the voltage generation circuit 19 generates various voltages to be applied to a word line and a source line described later by operations such as read and write. The voltage generation circuit 19 supplies the generated various voltages to be applied to the word line to the row decoder module 13, and supplies the generated voltages to be applied to the source line to the source line in the memory cell array 11.

The sense amplifier module 12 receives a column address from the address register 152 and decodes the received column address. The sense amplifier module 12 executes the transfer operation of the data DAT between the memory controller 2 and the memory cell array 11 as follows based on a result of the decoding. That is, the sense amplifier module 12 senses a threshold voltage of a memory cell transistor in the memory cell array 11 to generate the read data DAT, and outputs the generated read data DAT to the memory controller 2 via the input and output circuit 14. Further, the sense amplifier module 12 receives the write data DAT from the memory controller 2 via the input and output circuit 14, and transfers the received write data DAT to the memory cell array 11.

The row decoder module 13 receives a row address from the address register 152 and decodes the received row address. The row decoder module 13 selects a block BLK to be subjected to various operations such as the read operation and the write operation based on the result of the decoding. The row decoder module 13 can transfer the voltage supplied from the voltage generation circuit 19 to the selected block BLK.

(3) Memory Cell Array

Figure 3:
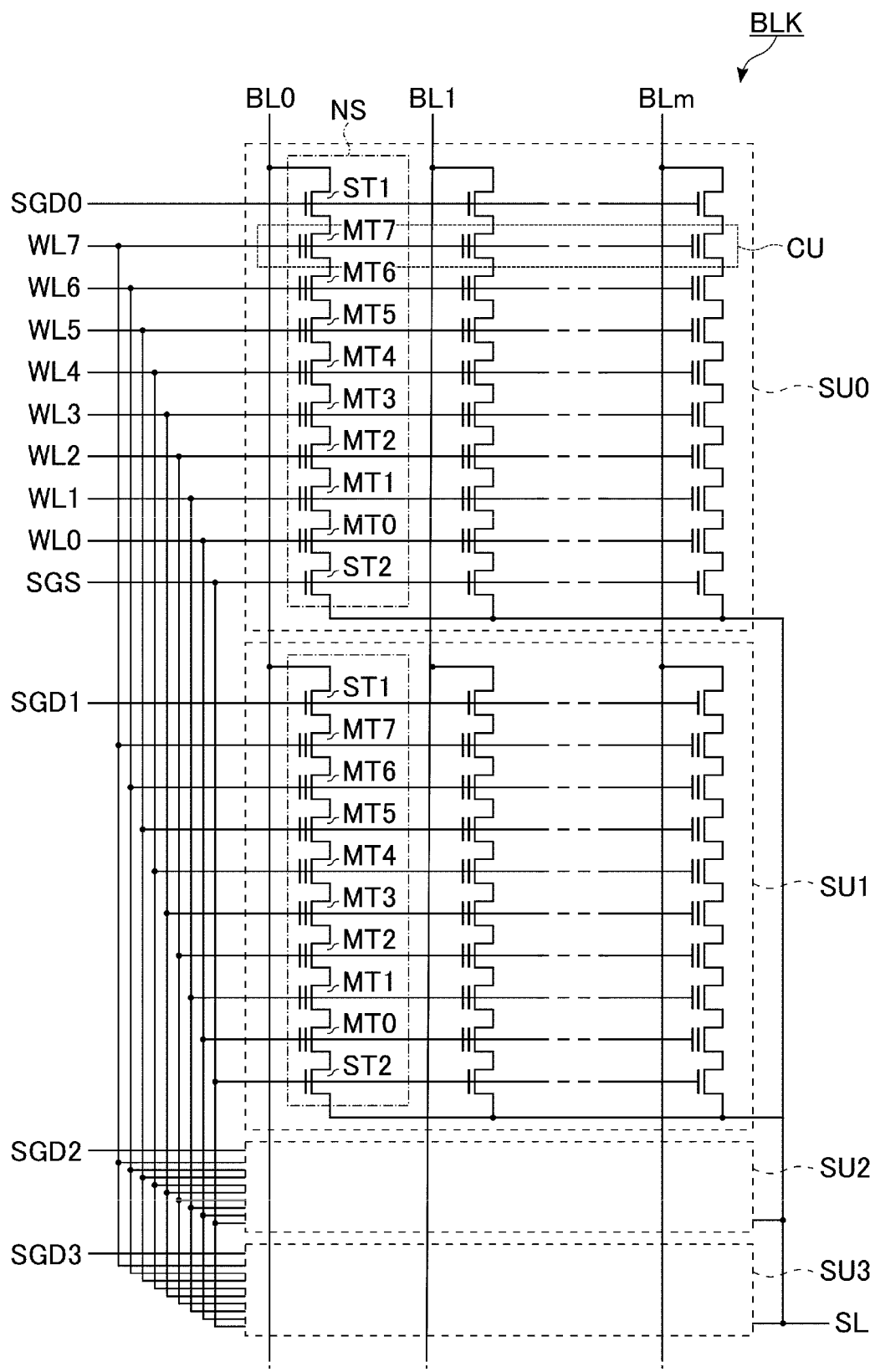
FIG. 3 is a diagram showing an example of a circuit configuration of a memory cell array in the semiconductor storage device according to the first embodiment.

FIG. 3 is a diagram showing an example of a circuit configuration of the memory cell array 11 in the semiconductor storage device 1 according to the first embodiment. As an example of the circuit configuration of the memory cell array 11, an example of a circuit configuration of one block BLK among a plurality of blocks BLK in the memory cell array 11 is shown. For example, each of the plurality of blocks BLK in the memory cell array 11 has the circuit configuration shown in FIG. 3.

As shown in FIG. 3, the block BLK includes, for example, four string units SU0 to SU3. Each string unit SU includes a plurality of NAND strings NS. Each NAND string NS is associated with a corresponding bit line BL among the bit lines BL0 to BLm (m is an integer of 1 or more), and includes, for example, memory cell transistors MT0 to MT7 and select transistors ST1 and ST2. Each memory cell transistor MT includes a control gate and a charge storage layer, and stores data in a nonvolatile manner. Each of the select transistors ST1 and ST2 is used to select the NAND string NS including the select transistors ST1 and ST2 during various operations.

A drain of the select transistor ST1 of each NAND string NS is connected to the corresponding bit line BL. The memory cell transistors MT0 to MT7 are connected in series between the source of the select transistor ST1 and the drain of the select transistor ST2. The source of the select transistor ST2 is connected to the source line SL.

The control gates of the memory cell transistors MTk of the plurality of NAND strings NS in the same block BLK are commonly connected to the word line WLk. Here, in the example in FIG. 3, k is any integer of 0 to 7. The gates (control gates) of the select transistors ST1 of the plurality of NAND strings NS in the same string unit SUj are commonly connected to the select gate line SGDj. Here, j is any integer of 0 to 3. The gates of the select transistors ST2 of the plurality of NAND strings NS in the same block BLK are commonly connected to the select gate line SGS.

Each bit line BL is commonly connected to the drain of the select transistor ST1 of the corresponding NAND string NS in each string unit SU. The source line SL is shared among the plurality of string units SU.

A set of a plurality of memory cell transistors MT commonly connected to a certain word line WL in one string unit SU is referred to as, for example, a cell unit CU. For example, a set of peer bits stored in each of the memory cell transistors MT in the cell unit CU is referred to as "one page", for example.

Although the circuit configuration of the memory cell array 11 has been described above, the circuit configuration of the memory cell array 11 is not limited to that described above. For example, the number of string units SU in each block BLK may be any number. In addition, the number of each of the memory cell transistors MT and the select transistors ST1 and ST2 in each of the NAND strings NS may be any numbers. The number of word lines WL and the number of select gate lines SGD and SGS are changed based on the number of memory cell transistors MT and the number of select transistors ST1 and ST2 in the NAND string NS.

Figure 4:
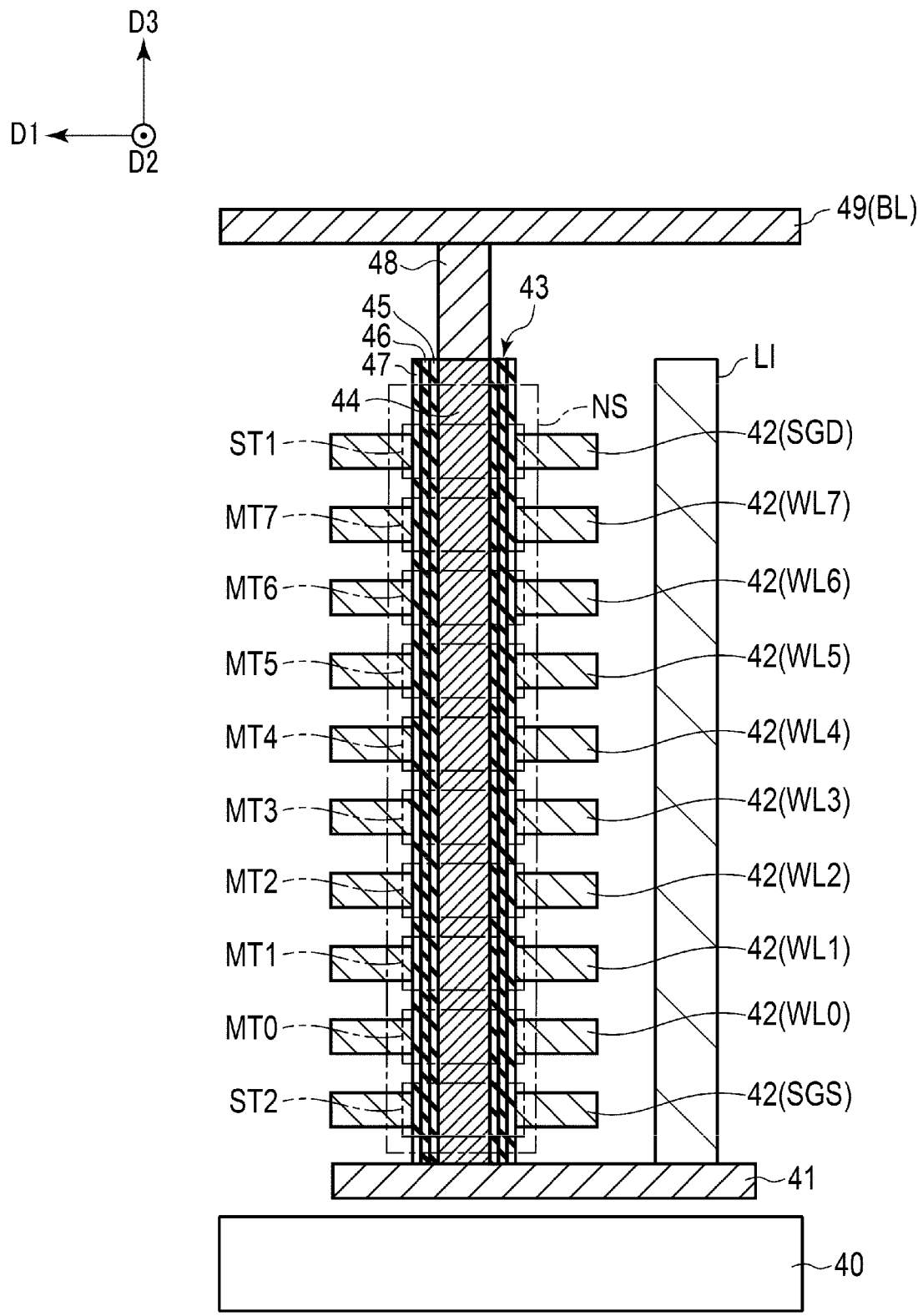
FIG. 4 is a diagram showing an example of a part of a cross-sectional structure of a memory cell array in the semiconductor storage device according to the first embodiment.

FIG. 4 is a cross-sectional view showing an example of a part of a cross-sectional structure of the memory cell array 11 in the semiconductor storage device 1 according to the first embodiment. In the example in FIG. 4, an interlayer insulator is omitted.

A part of the structure of the memory cell array 11 is implemented by conductors 41, 42, and 49, a memory pillar 43, and a contact plug 48.

The semiconductor storage device 1 includes a semiconductor substrate 40. Here, for example, two directions parallel to a surface of the semiconductor substrate 40 and orthogonal to each other are defined as a first direction D1 and a second direction D2. Further, a direction, for example, orthogonal to the surface of the semiconductor substrate 40 and in which the memory cell array 11 is formed on the basis of the semiconductor substrate 40 is defined as a third direction D3. In the following description, although the direction of the third direction D3 is described as upward and the direction opposite to the third direction D3 is described as downward, the notation is for convenience only and is independent of the direction of gravity, for example.

The conductor 41 is provided above the semiconductor substrate 40 via an insulator. The conductor 41 functions as the source line SL. A plurality of layers of the conductors 42 are sequentially stacked on the conductor 41 via an insulator between the adjacent conductors. In FIG. 4, for example, 10 layers of the conductors 42 are stacked, and the 10 layers of the conductors 42 respectively function as a select gate line SGS, word lines WL0 to WL7, and a select gate line SGD, from below to above.

The memory pillar 43 is provided in the plurality of layers of the conductors 42. The memory pillar 43 extends in the direction D3, for example. In the memory pillar 43, a tunnel insulating layer 45, a charge storage layer 46, and a block insulating layer 47 are sequentially provided on a side surface of a pillar-shaped semiconductor 44. A lower end of the semiconductor 44 reaches the conductor 41. A part of the memory pillar 43 that intersects with one conductor 42 functions as one memory cell transistor MT, one select transistor ST1, or one select transistor ST2. The semiconductor 44 functions as a current path of the NAND string NS, and serves as a region in which a channel of each memory cell transistor MT is formed. An upper end of the semiconductor 44 is connected to the conductor 49 via the contact plug 48. The conductor 49, for example, extends in the first direction D1, and functions as the bit line BL. Further, a conductor LI is provided on the conductor 41. The conductor LI, for example, extends in the second direction D2 and functions as a source line contact. The conductor LI has, for example, a line-shape along the second direction D2. For example, one string unit SU is disposed between the two conductors LI.

(4) Threshold Voltage Distribution of the Memory Cell Transistor

Figure 5:
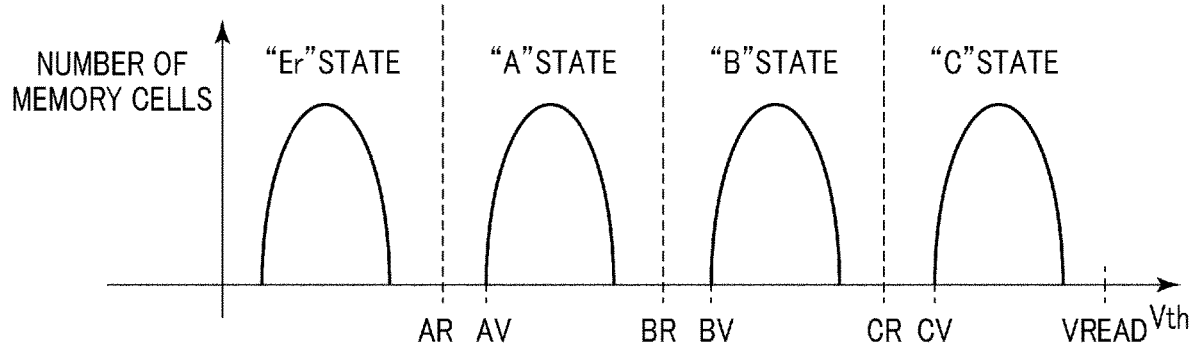
FIG. 5 is a diagram showing an example of a threshold voltage distribution formed by a memory cell transistor of the semiconductor storage device according to the first embodiment.

FIG. 5 is a diagram showing an example of threshold voltage distribution, data allocation, a read voltage, and a verify voltage when each memory cell transistor MT in the memory cell array 11 shown in FIG. 1 stores 2-bit data.

The memory cell transistor MT stores the 2-bit data based on a potential difference (hereinafter referred to as a threshold voltage) between a gate and source that enables the memory cell transistor MT to be switched from an OFF state to an ON state. The write operation performs the control of the threshold voltage of the memory cell transistor MT. FIG. 5 shows four threshold voltage distributions formed as a result of the control of the threshold voltage when the 2-bit data is stored in the memory cell transistor MT. In the threshold voltage distribution shown in FIG. 5, a vertical axis corresponds to the number of memory cell transistors MT, and a horizontal axis corresponds to a threshold voltage Vth of the memory cell transistor MT. In the horizontal axis, as an example, when a voltage VSS is applied to the source of the memory cell transistor MT, a voltage applied to the gate of the memory cell transistor MT, which enables the memory cell transistor MT to be switched from the OFF state to the ON state, is shown.

For example, the memory cell transistor MT is distinguished as belonging to any of the "Er" state, the "A" state, the "B" state, and the "C" state according to whether the threshold voltage of the memory cell transistor MT is included in the four threshold voltage distributions. The threshold voltage of the memory cell transistor MT is increased in the order in which the state to which the memory cell transistor MT belongs is the "Er" state, the "A" state, the "B" state, and the "C" state. For example, "11" ("upper bit/lower bit") data is allocated to the "Er" state, "01" data is allocated to the "A" state, "00" data is allocated to the "B" state, and "10" data is allocated to the "C" state. The data allocated to the state to which the memory cell transistor MT belongs is data stored in the memory cell transistor MT.

The verify voltages used in the write operation are set respectively between adjacent threshold voltage distributions. Specifically, a verify voltage AV is set corresponding to the "A" state, a verify voltage BV is set corresponding to the "B" state, and a verify voltage CV is set corresponding to the "C" state. The verify voltage is a voltage used in a verify operation for checking whether or not the threshold voltage of the memory cell transistor MT exceeds a predetermined voltage.

For example, when the verify voltage AV is applied, it can be seen that the memory cell transistor MT in the ON state belongs to the "Er" state, and the memory cell transistor MT in the OFF state belongs to any one of the "A" state, the "B" state, and the "C" state. As a result, for example, as a result of the write operation of the "01" data, it is possible to check whether or not the threshold voltage of the memory cell transistor MT to be written is included in the threshold voltage distribution of the "A" state, the "B" state, and the "C" state. The same applies to other verify voltages BV and CV.

In addition, the read voltages used in the read operation are respectively set between adjacent threshold voltage distributions. Specifically, a read voltage AR is set corresponding to the "A" state, a read voltage BR is set corresponding to the "B" state, and a read voltage CR is set corresponding to the "C" state. The read voltage is a voltage used in the read operation for checking which state the memory cell transistor MT belongs to.

For example, when the read voltage AR is applied, it can be seen that the memory cell transistor MT in the ON state belongs to the "Er" state, and the memory cell transistor MT in the OFF state belongs to one of the states of "A" state, the "B" state, and the "C" state. As a result, it is possible to determine whether the memory cell transistor MT belongs to the "Er" state or the "A" state, the "B" state, and the "C" state. The same applies to other read voltages BR and CR.

There is a following magnitude relationship between the verify voltage and the read voltage. That is, the verify voltage AV is higher than the read voltage AR, the verify voltage BV is higher than the read voltage BR, and the verify voltage CV is higher than the read voltage CR.

Further, a read pass voltage VREAD is set so as to be always higher than the threshold voltage of the memory cell transistor MT belonging to the highest "C" state. The memory cell transistor MT whose gate the read pass voltage VREAD is applied to is in the ON state regardless of the data to be stored.

The number of bits of the data stored in one memory cell transistor MT described above and the allocation of the data with respect to the threshold voltage distribution are merely examples, the present disclosure is not limited thereto. For example, one bit or three or more bits of data may be stored in each memory cell transistor MT.

(5) Sense Amplifier Module

Figure 6:
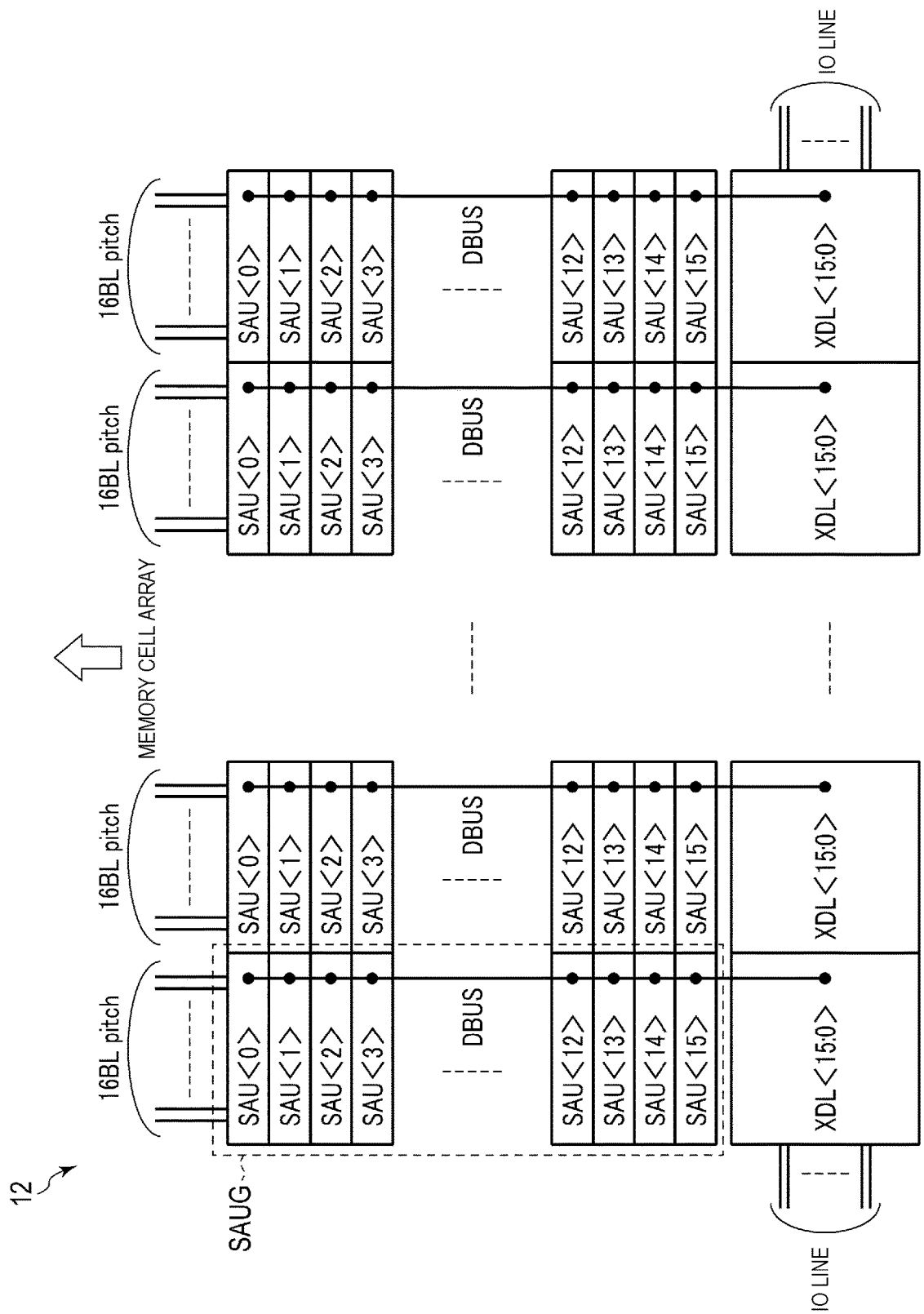
FIG. 6 is a block diagram showing an example of a configuration of a sense amplifier module in the semiconductor storage device according to the first embodiment.

FIG. 6 is a block diagram showing an example of a configuration of the sense amplifier module 12 in the semiconductor storage device 1 according to the first embodiment.

As shown in FIG. 6, the sense amplifier module 12 includes a plurality of sense amplifier units SAU and a plurality of latch circuits XDL.

The sense amplifier unit SAU is provided, for example, for each bit line BL. Each sense amplifier unit SAU senses the threshold voltage of the memory cell transistor MT connected to the corresponding bit line BL, and transfers the write data to the corresponding bit line BL.

For example, a group SAUG of 16 sense amplifier units SAU<0> to SAU<15> is provided for each combination of 16 bit lines BL, and a plurality of the groups SAUG are provided. For example, the sense amplifier units SAU<0> to SAU<15> of one group SAUG are commonly connected to one bus DBUS.

The latch circuit XDL is provided for each sense amplifier unit SAU. For example, a group of 16 latch circuits XDL<0> to XDL<15> is provided for each group SAUG of the above described 16 sense amplifier units SAU<0> to SAU<15>. In FIG. 6, the 16 latch circuits XDL<0> to XDL<15> are shown as the latch circuit XDL<15:0>. The latch circuit XDL<15:0> of one group are commonly connected to the bus DBUS. Each latch circuit XDL is associated with one bit line BL via a corresponding sense amplifier unit SAU, and temporarily stores data related to the bit line BL. Further, each of the latch circuits XDL<0> to XDL<15> is connected to a corresponding data line IO among the plurality of data lines IO.

The latch circuit XDL enables transception of data between the corresponding sense amplifier unit SAU and the input and output circuit 14 via the bus DBUS and the data line IO. That is, for example, the data received from the memory controller 2 or the like is firstly stored in the latch circuit XDL via the data line IO, and then transferred to the sense amplifier unit SAU via the bus DBUS. The reverse is also the same. The data in the sense amplifier unit SAU is transferred to and stored by the latch circuit XDL via the bus DBUS, and is output to the outside of the semiconductor storage device 1 after being transferred to the input and output circuit 14 via the data line IO.

Figure 7:
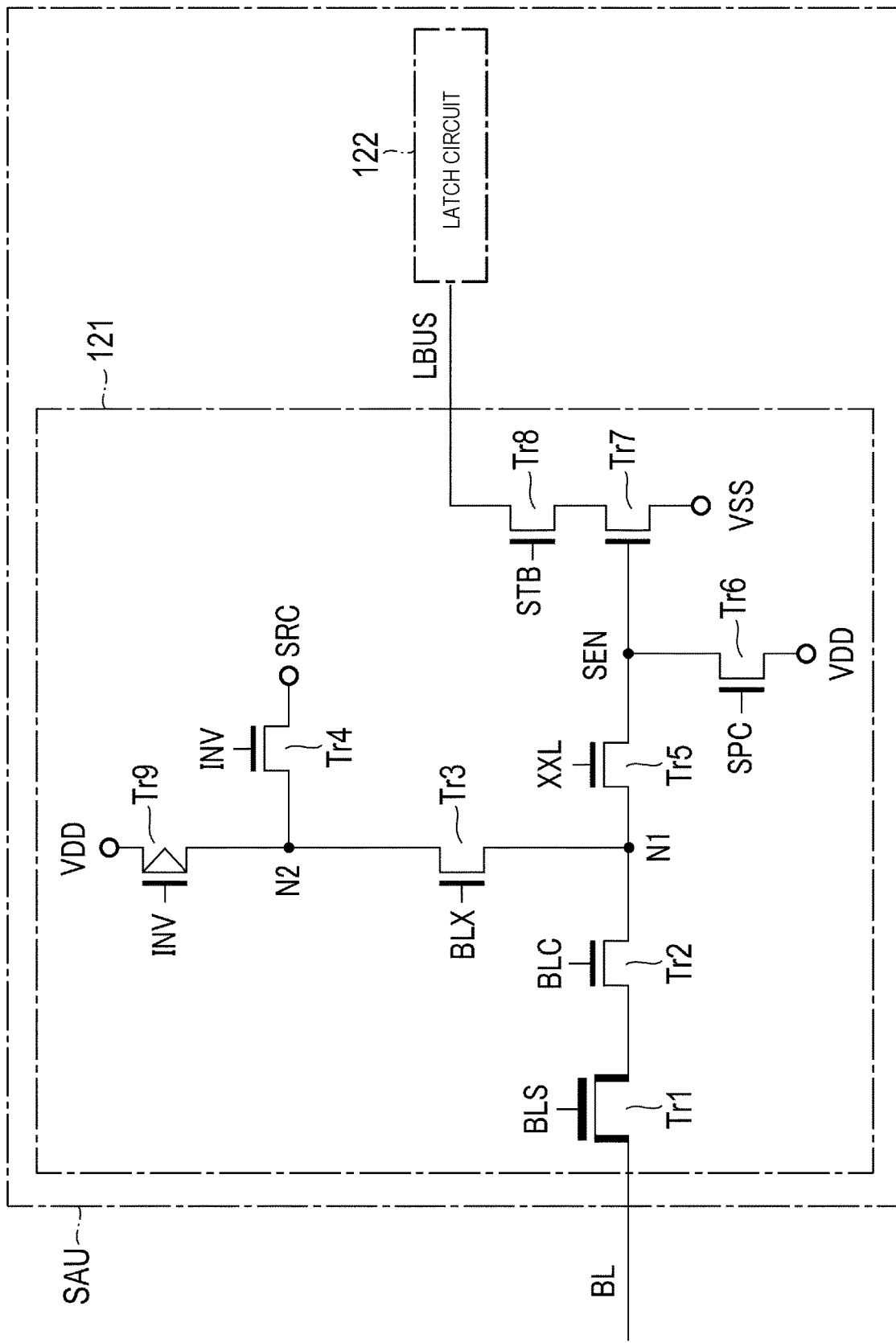
FIG. 7 is a diagram showing an example of a part of a circuit configuration of the sense amplifier module in the semiconductor storage device according to the first embodiment.

FIG. 7 is a diagram showing an example of a part of a circuit configuration of the sense amplifier module 12 in the semiconductor storage device 1 according to the first embodiment. Hereinafter, the circuit configuration of a certain sense amplifier unit SAU in the sense amplifier module 12 will be described in detail. In the following description, the memory cell transistor MT to be written or to be read is referred to as a selected memory cell transistor MT. The configuration of the sense amplifier module 12 described in detail below is merely an example, and various configurations may be applied to the sense amplifier module 12.

One sense amplifier unit SAU includes a sense amplifier circuit 121 and a latch circuit 122. When each memory cell transistor MT stores two or more bits of data or the like, two or more latch circuits are provided based on the number of bits of the data.

The sense amplifier circuit 121 includes a high breakdown voltage n-channel MOS transistor Tr1, n-channel MOS transistors Tr2, Tr3, . . . and Tr8, and a p-channel MOS transistor Tr9.

A first terminal of the transistor Tr1 is connected to the corresponding bit line BL, and a second terminal of the transistor Tr1 is connected to a first terminal of the transistor Tr2. A control signal BLS is applied to a gate of the transistor Tr1. A second terminal of the transistor Tr2 is connected to a node N1, and a control signal BLC is applied to a gate of the transistor Tr2. The transistor Tr2 can clamp the corresponding bit line BL to a potential corresponding to the control signal BLC.

A first terminal of the transistor Tr3 is connected to the node N1, and a second terminal of the transistor Tr3 is connected to a node N2. A control signal BLX is applied to a gate of the transistor Tr3. A first terminal of the transistor Tr4 is connected to the node N2, and a voltage SRC is applied to a second terminal of the transistor Tr4. The voltage SRC is, for example, a voltage applied to a source line SL, and is, for example, a voltage VSS. The gate of the transistor Tr4 is connected to a node INV. A first terminal of the transistor Tr9 is connected to the node N2, and a voltage VDD is applied to a second terminal of the transistor Tr9. The voltage VDD is, for example, a power supply voltage. A gate of the transistor Tr9 is connected to the node INV.

A first terminal of the transistor Tr5 is connected to the node N1, and a second terminal of the transistor Tr5 is connected to a node SEN. A control signal XXL is applied to a gate of the transistor Tr5. A first terminal of the transistor Tr6 is connected to the node SEN, and the voltage VDD is applied to a second terminal of the transistor Tr6. A control signal SPC is applied to a gate of the transistor Tr6.

The transistor Tr9 and the transistor Tr3 enable the bit line BL to be precharged. The transistor Tr6 enables the node SEN to be precharged. The transistor Tr5 enables the node SEN to be discharged in a data sense. The transistor Tr4 and the transistor Tr3 enable the bit line BL to be fixed at a constant potential.

A voltage VSS is applied to a first terminal of the transistor Tr7, and a second terminal of the transistor Tr7 is connected to a first terminal of the transistor Tr8. The voltage VSS is, for example, a reference voltage. A gate of the transistor Tr7 is connected to the node SEN. A second terminal of the transistor Tr8 is connected to a node LBUS, and a control signal STB is applied to a gate of the transistor Tr8. The node LBUS is a signal path connecting the sense amplifier circuit 121 and the latch circuit 122.

The transistor Tr7 can sense whether the read data is "0" or "1" based on the potential of the node SEN. The transistor Tr8 can determine a sense timing of the data and store the read data in the latch circuit 122.

The node INV is a node in the latch circuit 122, and can take a logic level corresponding to the data stored in the latch circuit 122. For example, when the selected memory cell transistor MT is in the ON state when the data is read and the potential of the node SEN is sufficiently decreased, the node INV becomes a high (H) level. On the other hand, when the selected memory cell transistor MT is in the OFF state and the potential of the node SEN is not sufficiently decreased, the node INV is at a low (L) level.

In the above configuration, at the timing when the control signal STB is asserted, the read data based on the potential of the node SEN is transferred to the latch circuit 122 by the transistor Tr8. The control signals STB, BLS, BLC, BLX, XXL, and SPC are supplied by, for example, the sequencer 17.

Figure 8:
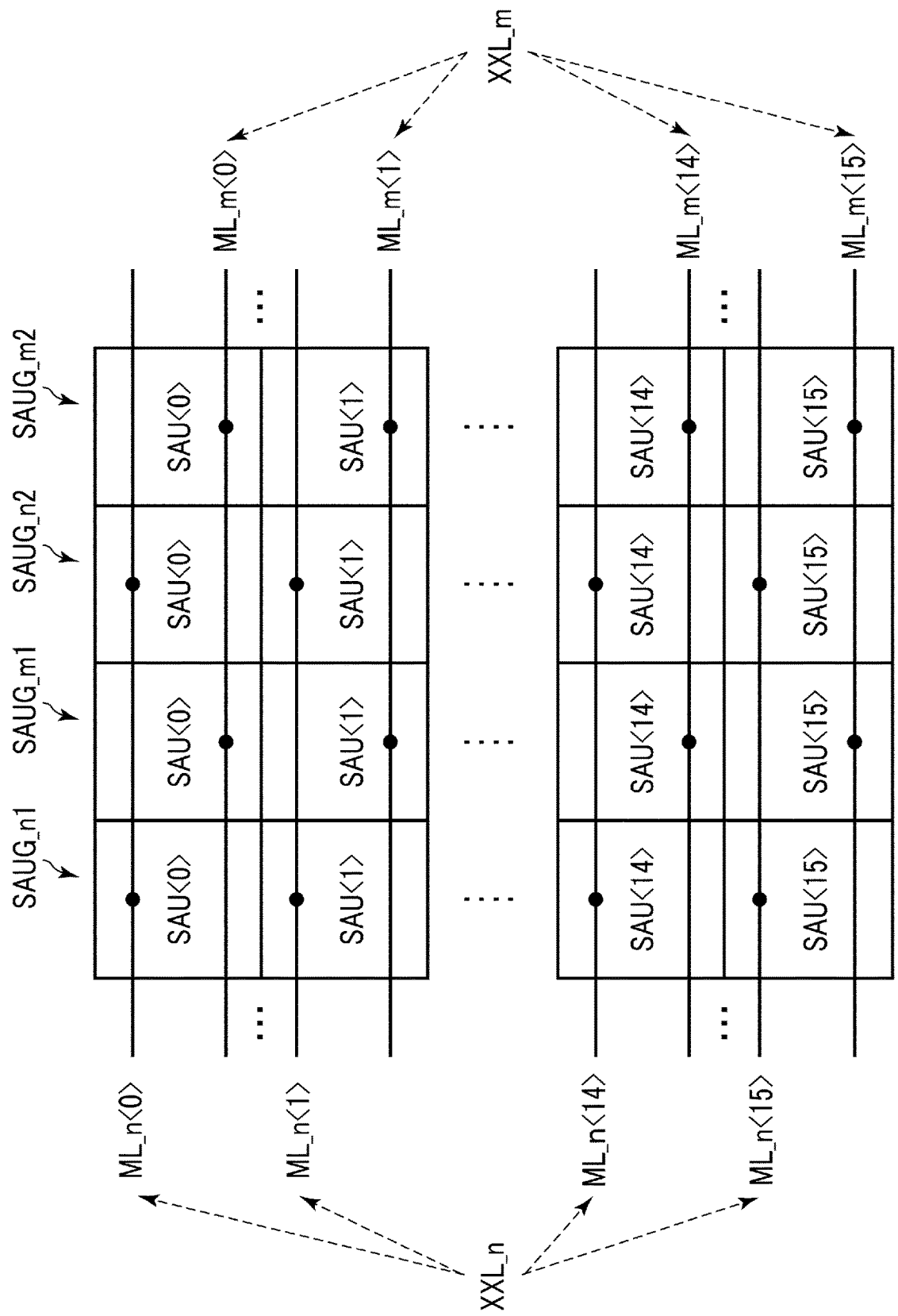
FIG. 8 is a block diagram showing an example of allocation of a control signal supplied to each sense amplifier unit in the semiconductor storage device according to the first embodiment.

FIG. 8 is a block diagram showing an example of allocation of control signals supplied to each sense amplifier unit SAU in the semiconductor storage device 1 according to the first embodiment. In the semiconductor storage device 1, the control signals XXL_n and XXL_m that can be controlled independently of each other are used as the control signal XXL described with reference to FIG. 7.

Any one of the control signals XXL_n and XXL_m is commonly supplied to the sense amplifier units SAU<0> to SAU<15> of one group SAUG.

Among the plurality of groups SAUG described above, the group SAUG of the sense amplifier units SAU<0> to SAU<15> to which the control signal XXL_n is supplied is referred to as a group SAUG_n (SAUG_n1, SAUG_n2, . . . ).

Among the plurality of groups SAUG described above, the group SAUG of the sense amplifier units SAU<0> to SAU<15> to which the control signal XXL_m is supplied is referred to as a group SAUG_m (SAUG_m1, SAUG_m2, . . . ).

The plurality of groups SAUG described above are sequentially adjacent to each other along a certain direction on the semiconductor substrate 40 such that the groups SAUG_n and SAUG_m are alternately arranged. For example, the plurality of groups SAUG described above are sequentially adjacent to each other in the order of the group SAUG_n1, the group SAUG_m1, the group SAUG_n2, and the group SAUG_m2, . . . along the above certain direction.

The supply of the control signals XXL_n and XXL_m to the sense amplifier units SAU may be implemented by, for example, the following configuration.

For example, the sense amplifier unit SAU<i> of the group SAUG_n is commonly connected to a wiring ML_n<i>. Here, i is any integer of 0 to 15. The control signal XXL_n is supplied to the wirings ML_n<0> to ML_n<15>.

For example, the sense amplifier unit SAU<i> of the group SAUG_m is commonly connected to a wiring ML_m<i>. The control signal XXL_m is supplied to the wirings ML_m<0> to ML_m<15>.

Similarly, in the semiconductor storage device 1, the control signals SPC_n and SPC_m that can be controlled independently of each other are used as the control signals SPC described with reference to FIG. 7, and the control signals STB_n and STB_m that can be controlled independently of each other are used as the control signals STB described with reference to FIG. 7.

In the sense amplifier units SAU<0> to SAU<15> of the group SAUG_n, the control signals SPC_n and STB_n are commonly supplied in the same manner as described above for the control signal XXL_n. In the sense amplifier units SAU<0> to SAU<15> of the group SAUG_m, the control signals SPC_m and STB_m are commonly supplied in the same manner as described above for the control signal XXL_m.

FIG. 9 is a diagram showing an example of a layout of a sense amplifier unit SAU in the semiconductor storage device 1 according to the first embodiment and a transistor Tr in the sense amplifier unit SAU. In the example of FIG. 9, a structure corresponding to the memory cell array 11 and a structure corresponding to the sense amplifier module 12 are aligned along the first direction D1.

The sense amplifier units SAU<0> to SAU<15> of each group SAUG are sequentially adjacent to each other in the order of the sense amplifier unit SAU<0>, the sense amplifier unit SAU<1>, . . . and the sense amplifier unit SAU<15> along the first direction D1. Further, the plurality of groups SAUG are sequentially adjacent to each other along the second direction D2 such that the group SAUG_n and the group SAUG_m are alternately arranged. More specifically, the sense amplifier units SAU<i> of the plurality of groups SAUG described above are sequentially adjacent to each other along the second direction D2 such that the sense amplifier unit SAU<i> of the group SAUG_n and the sense amplifier unit SAU<i> of the group SAUG_m are alternately arranged.

FIG. 9 illustrates four sense amplifier units SAU<0>, and the four sense amplifier units SAU<0> are provided along the second direction D2 so as to be sequentially adjacent to each other in the order of the sense amplifier unit SAU<0> of the group SAUG_n1, the sense amplifier unit SAU<0> of the group SAUG_m1, the sense amplifier unit SAU<0> of the group SAUG_n2, and the sense amplifier unit SAU<0> of the group SAUG_m2. Hereinafter, although the sense amplifier unit SAU<0> will be described in detail by way of example, the same applies to the sense amplifier units SAU<1> to SAU<15>.

In each sense amplifier unit SAU<0>, the transistors Tr are sequentially adjacent to each other at an interval along the first direction D1. Each transistor Tr corresponds to, for example, any of the transistors Tr1 to Tr9 shown in FIG. 7. Each transistor Tr includes a pair of source region and drain region (not shown) and a gate electrode (not shown). A pair of the source region and drain region are provided on a surface of an active area AA of the semiconductor substrate 40 at an interval, for example, along the first direction D1. The gate electrode is provided on an upper surface of the active area AA between the source region and the drain region via a gate insulator (not shown). A contact plug GC is provided on a gate electrode of each transistor Tr, and a contact plug CS is provided on a source region or a drain region of each transistor Tr. Here, in the example illustrated in FIG. 9, one contact plug CS is provided on the source region or the drain region of one transistor Tr, and on the source region or the drain region of the other transistor Tr which are sandwiched between the gate electrodes of two transistors Tr provided adjacent to each other along the first direction D1. Therefore, in each sense amplifier unit SAU<0>, the contact plug CS and the contact plug GC are alternately provided and sequentially adjacent to each other while having an interval along the first direction D1. For example, in the connection according to the transistor Tr described with reference to FIG. 7, such contact plugs GC and CS are used.

An active area AA in one of the sense amplifier units SAU<0> provided adjacent to each other along the second direction D2 and an active area AA in the other are provided at an interval from each other. The interval enables the transistor Tr provided on a surface of one of the two active areas AA provided at the interval and the transistor Tr provided on a surface of the other to operate independently of each other.

In the sense amplifier units SAU<0> provided sequentially adjacent to each other along the second direction D2, the transistors Tr of each sense amplifier unit SAU<0> corresponding to each other are sequentially adjacent to each other while having the interval along the second direction D2. Here, the transistor Tr corresponding to each other means, for example, the same transistor Tr shown in FIG. 7 in each sense amplifier unit SAU<0>.

In addition, in the sense amplifier units SAU<0> provided sequentially adjacent to each other along the second direction D2, the contact plugs CS of each sense amplifier unit SAU<0> corresponding to each other are sequentially adjacent to each other while having the interval along the second direction D2. Similarly, the contact plugs GC of each sense amplifier units SAU<0> corresponding to each other are sequentially adjacent to each other while having the interval along the second direction D2. Here, the contact plugs CS or GC corresponding to each other mean the contact plugs CS or GC according to the same source, drain or gate of the same transistor Tr.

For example, the contact plugs CS according to the node SEN described above in each sense amplifier unit SAU<0> are sequentially adjacent to each other while having the interval along the second direction D2. That is, the contact plugs CS according to the node SEN are provided so as to be sequentially adjacent to each other along the second direction D2 such that the contact plugs CS according to the node SEN in the sense amplifier unit SAU<0> of the group SAUG_n and the contact plugs CS according to the node SEN in the sense amplifier unit SAU<0> of the group SAUG_m are alternately arranged.

FIG. 10A and FIG. 10B are a diagram showing an example of a part of a cross-sectional structure of the semiconductor storage device 1 according to the first embodiment. Also in the example in FIG. 10A and FIG. 10B, the interlayer insulator is omitted.

FIG. 10A illustrates an example of a part of a cross-sectional structure when the semiconductor storage device 1 is taken along a plane perpendicular to the second direction D2.

A structure corresponding to the memory cell array 11 as described with reference to FIG. 4 is provided above the semiconductor substrate 40. A transistor Tr is provided on the upper surface of the semiconductor substrate 40 in a region different from a region in which the structure corresponding to the memory cell array 11 is located above. The transistor Tr corresponds to the transistor Tr described with reference to FIG. 9.

More specifically, the active area AA is provided in a region of the semiconductor substrate 40 which is different from the region in which the structure corresponding to the memory cell array 11 is located above. The active area AA reaches the upper surface of the semiconductor substrate 40. As described with reference to FIG. 9, the transistor Tr includes a pair of source region S and drain region D provided on the surface of the active area AA, and a gate electrode G provided above the upper surface of the active area AA between the source region S and the drain region D via a gate insulator.

A contact plug GC is provided on the gate electrode G of the transistor Tr, and contact plugs CS are provided on the source region S and the drain region D of the transistor Tr. In the following description, the contact plugs GC and CS are collectively referred to as a contact plug CP0. The upper surface of each contact plug CP0 is connected to a wiring in a metal wiring layer L0. A certain wiring in the metal wiring layer L0 functions as, for example, a bus DBUS.

A contact plug CP1 is provided on the upper surface of the wiring in the metal wiring layer L0. The upper surface of the contact plug CP1 is connected to the wiring in a metal wiring layer L1. A certain wiring in the metal wiring layer L1 functions as, for example, a bit line BL. A contact plug CP2 is provided on the upper surface of the wiring in the metal wiring layer L1. The upper surface of the contact plug CP2 is connected to the wiring in a metal wiring layer L2.

FIG. 10B shows an example of a part of a cross-sectional structure when the semiconductor storage device 1 is taken along a plane perpendicular to the first direction D1. The example of FIG. 10B illustrates the transistor Tr illustrated in FIG. 10A and the transistor Tr provided adjacent to the transistor Tr along the second direction D2 described with reference to FIG. 9.

As described with reference to FIG. 9, the active area AA in which one of the two transistors Tr is provided and the active area AA in which the other is provided are provided at an interval in the semiconductor substrate 40.

A length along a third direction D3 of each contact plug CP0 with respect to a distance between the contact plugs CP0 of the two transistors Tr is so long as parasitic capacitance is generated between the contact plugs CP0. The two contact plugs CP0 may be any combination of the contact plug GC and the two contact plugs CS of one transistor Tr and the contact plug GC and the two contact plugs CS of the other transistor Tr. Due to the parasitic capacitance generated in this manner, one potential of the two contact plugs CP0 in which the parasitic capacitance is generated may be influenced by the change of the other potential.

For example, parasitic capacitance is generated between the contact plugs CS according to the node SEN provided adjacent to each other as described with reference to FIG. 9.

Operation Example

Figure 11:
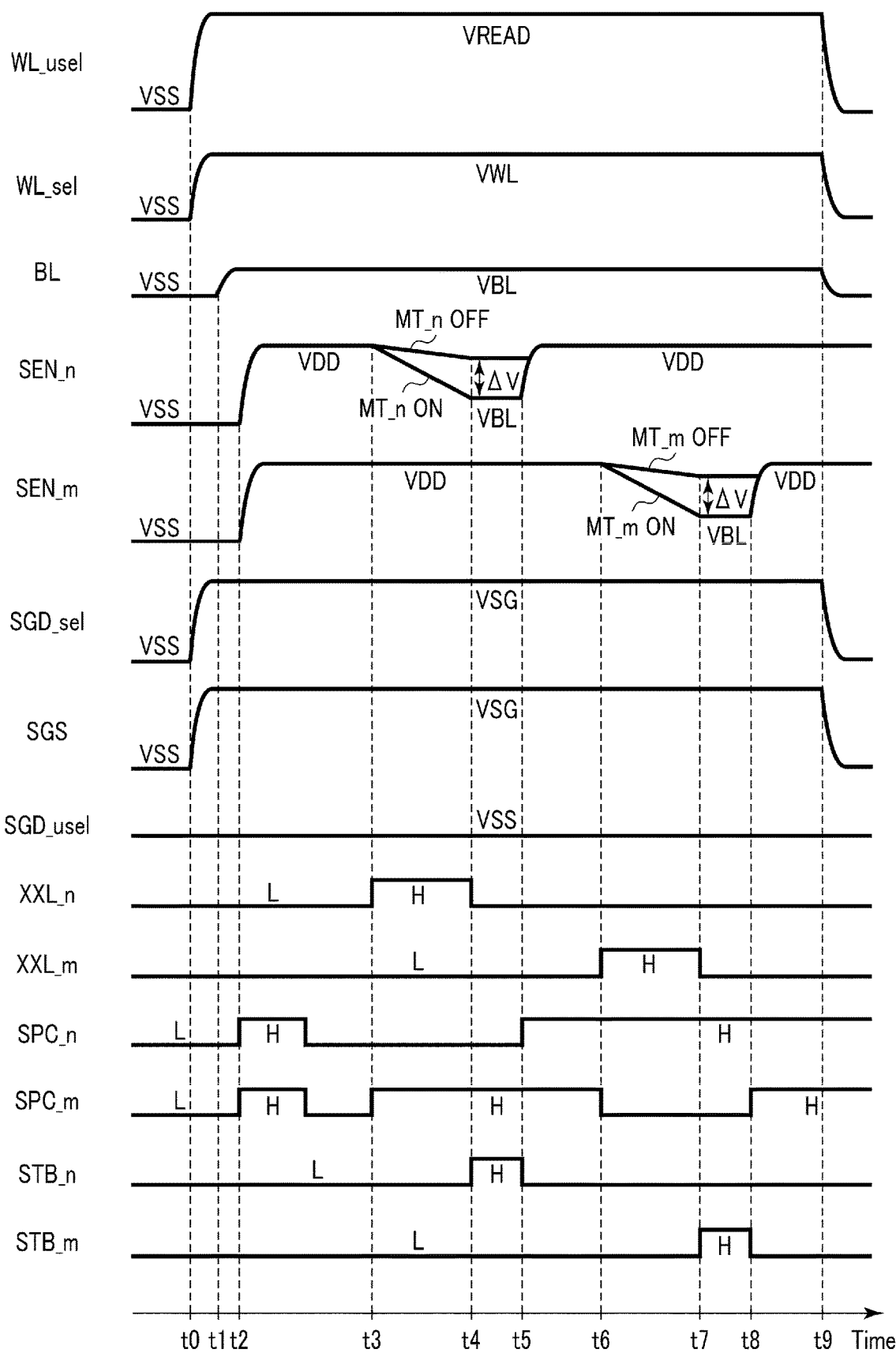
FIG. 11 is a timing chart showing an example of a temporal change of a voltage that is applied to various circuit components according to a sense amplifier unit and is used in a read operation in the semiconductor storage device according to the first embodiment.

FIG. 11 is a timing chart showing an example of a temporal change of a voltage applied to various circuit components according to the sense amplifier unit SAU which is used in a read operation in the semiconductor storage device 1 according to the first embodiment. FIG. 11 shows an example in which the read operation using a read voltage VWL is executed. The read voltage VWL is, for example, any one of the read voltages AR, BR, and CR described with reference to FIG. 5. In the timing chart shown in FIG. 11, the voltage applied to the source line SL is omitted in order to facilitate the reference of the drawing. Further, the read operation described in detail below is merely an example, and the read operation according to the present embodiment is not limited thereto. Hereinafter, although the read operation will be described, same operation can also be executed for verify operation.

In the following description, a word line connected to a selected memory cell transistor MT is referred to as a selected word line WL_sel, and a word line not connected to the selected memory cell transistor MT is referred to as a non-selected word line WL_use1. Further, among select gate lines SGD, a select gate line SGD of a selected string unit SU is referred to as a selected select gate line SGD_sel, and a select gate line of a non-selected string unit SU is referred to as a non-selected select gate line SGD_use1. Further, the node SEN in any sense amplifier unit SAU of the group SAUG_n described above is referred to as a node SEN_n, and the node SEN in any sense amplifier unit SAU of the group SAUG_m described above is referred to as a node SEN_m. For example, as described with reference to FIGS. 9 and 10, a parasitic capacitance is generated between the contact plug CS according to the node SEN_n in a certain sense amplifier unit SAU of the group SAUG_n and the contact plug CS according to the node SEN_m in a certain sense amplifier unit SAU of the group SAUG_m.

The voltage application to the word lines WL_sel and WL_use1 and the select gate lines SGD_sel, SGD_use1, and SGS is executed by control of the voltage generation circuit 19 and the row decoder module 13 by the sequencer 17. The voltage application to the source line SL is executed by the control of the voltage generation circuit 19 by the sequencer 17. The voltage application to the bit line BL is executed by the control of the voltage generation circuit 19 and the sense amplifier module 12 by the sequencer 17. Further, control signals XXL_n and XXL_m, control signals SPC_n and SPC_m, and control signals STB_n and STB_m are supplied by the sequencer 17.

In the example in FIG. 11, at the start of the read operation, the voltages applied to the word lines WL_sel and WL_use1, the select gate lines SGD_sel, SGD_use1, and SGS, the bit lines BL, and the source line SL are voltages VSS, respectively. Further, the voltages of the control signals XXL_n and XXL_m, the control signals SPC_n and SPC_m, and the control signals STB_n and STB_m are each at L level. At this time, the voltages of the nodes SEN_n and SEN_m are, for example, the voltages VSS.

At time t0, the read voltage VWL is applied to the selected word line WL_sel, and a voltage VREAD is applied to the non-selected word line WL_use1. At this time, the voltage VSG is applied to the select gate lines SGD_sel and SGS, and the voltage VSS is continuously applied to the select gate line SGD_use1. Further, the voltage VSS is applied to the source line SL. Thereafter, at time t1, charging of the bit line BL is started. In the charging, a voltage VBL is applied to the bit line BL. The voltage VBL is, for example, a voltage that enables a read current to flow to the corresponding bit line BL when the selected memory cell transistor MT is in the ON state.

First, the read operation using the read voltage VWL is executed by the sense amplifier unit SAU of the group SAUG_n.

At time t2, the control signals SPC_n and SPC_m are set to an H level. As a result, the voltage VDD is applied to the nodes SEN_n and SEN_m, and the potentials of the nodes SEN_n and SEN_m increase. After the potentials of the nodes SEN_n and SEN_m are stabilized, the control signals SPC_n and SPC_m are set to an L level.

Next, at time t3, the control signal SPC_m is set to the H level. As a result, the voltage VDD continues to be applied to the node SEN_m, and the potential of the node SEN_m is maintained. On the other hand, at this time, the control signal XXL_n is set to the H level. As a result, the node SEN_n is electrically connected to the bit line BL, and the potential of the node SEN_n starts to decrease. A degree (rate, or slope) of the decrease is larger when the selected memory cell transistor MT_n connected to the node SEN_n is in the ON state by the read voltage VWL than when the selected memory cell transistor MT_n is in the OFF state.

Thereafter, at time t4, the control signal XXL_n is set to the L level. When the selected memory cell transistor MT_n is in the ON state, the potential of the node SEN_n at this time is decreased to a potential equivalent to that of the bit line BL, for example. A potential difference between the potential of the node SEN_n when the selected memory cell transistor MT_n is in the ON state and the potential of the node SEN_n when the selected memory cell transistor MT_n is in the OFF state at time t4 is set to ΔV. At time t4, the control signal STB_n is set to the H level and asserted. As a result, the read data based on the read voltage VWL is transferred to the latch circuit described with reference to FIG. 7.

Subsequent to the read operation by the sense amplifier unit SAU of the group SAUG_n, a read operation using the read voltage VWL by the sense amplifier unit SAU of the group SAUG_m is executed.

The control signal SPC_m set to the H level is maintained at the H level even at time t5. As a result, even at time t5, the voltage VDD continues to be applied to the node SEN_m, and the potential of the node SEN_m is maintained. On the other hand, at this time, the control signal SPC_n is set to the H level. As a result, the voltage VDD is applied to the node SEN_n, and the potential of the node SEN_n rises. Thereafter, the potential of the node SEN_n is stabilized.

The control signal SPC_n set to the H level is maintained at the H level even at time t6. As a result, even at time t6, the voltage VDD continues to be applied to the node SEN_n, and the potential of the node SEN_n is maintained. On the other hand, at this time, the control signal SPC_m maintained at the H level is set to the L level, and the control signal XXL_m is set to the H level. As a result, the node SEN_m is electrically connected to the bit line BL, and the potential of the node SEN_m starts to decrease. The degree (rate, or slope) of the decrease is larger when the selected memory cell transistor MT_m connected to the node SEN_m is in the ON state by the read voltage VWL than when the selected memory cell transistor MT_m is in the OFF state.

Thereafter, at time t7, the control signal XXL_m is set to the L level. When the selected memory cell transistor MT_m is in the ON state, the potential of the node SEN_m decreases to a potential equivalent to that of the bit line BL, for example. A potential difference between the potential of the node SEN_m when the selected memory cell transistor MT_m is in the ON state and the potential of the node SEN_m when the selected memory cell transistor MT_m is in the OFF state at time t7 is ΔV. At time t7, the control signal STB_m is set to the H level and asserted. As a result, the read data based on the read voltage VWL is transferred to the latch circuit described with reference to FIG. 7.

The control signal SPC_n set to the H level is maintained at the H level even at time t8. As a result, even at time t8, the voltage VDD continues to be applied to the node SEN_n, and the potential of the node SEN_n is maintained. On the other hand, at this time, the control signal SPC_m is set to the H level. As a result, the voltage VDD is applied to the node SEN_m, and the potential of the node SEN_m rises. Thereafter, the potential of the node SEN_m is stabilized.

Thereafter, at time t9, the voltages applied to the word lines WL_sel and WL_use1, the select gate lines SGD_sel and SGS, and the bit lines BL are respectively set to the voltage VSS.

The timing chart described in detail above is merely an example. For example, a case where one of the nodes SEN_n and SEN_m is electrically connected to the corresponding bit line BL as at times t3 to t4 and times t6 to t7 is described. In this case, for example, the condition of the potential immediately before the connection of the node SEN electrically connected to the bit line BL and the potential of the other node SEN between the connection may be coincident when the node SEN_n is electrically connected to the bit line BL and a case where the node SEN_m is electrically connected to the bit line BL. That is, the potential of the node SEN_m at time t3 to time t4 and the potential of the node SEN_n at time t6 to time t7 may be coincident with each other, which do not necessarily have to be the voltage VDD.

[Effect]

FIG. 12 is a timing chart showing an example of a temporal change of a voltage applied to various circuit components according to a certain sense amplifier unit SAU_a used in a read operation in the semiconductor storage device according to a comparative embodiment. The semiconductor storage device according to the comparative embodiment has the same configuration as that described for the semiconductor storage device 1 according to the first embodiment except that the common control signals XXL, SPC, and STB are supplied to each sense amplifier unit SAU, for example. FIG. 12 shows only a timing chart for the node SEN_a and the control signal XXL of the sense amplifier unit SAU_a in order to facilitate the reference. The control signals SPC and STB will be described later. The timing chart for the voltage applied to other wiring is the same as that shown in FIG. 11.

At time t10, the control signal SPC is set to the H level, so that the voltage VDD is applied to the node SEN_a. After the potential of the node SEN_a is stabilized, the control signal SPC is set to the L level, and then at time t11, the control signal XXL is set to the H level. As a result, the node SEN_a is electrically connected to the bit line BL, and the potential of the node SEN_a starts to decrease. The degree (rate, or slope) of the decrease is larger when the selected memory cell transistor MT_a connected to the node SEN_a is in the ON state than when the selected memory cell transistor MT_a is in the OFF state.

Thereafter, at time t12, the control signal XXL is set to the L level. When the selected memory cell transistor MT_a is in the ON state, the potential of the node SEN_a at this time decreases to a potential equivalent to that of the bit line BL, for example. This potential is stabilized by, for example, the voltage VBL. In this regard, the operation of the semiconductor storage device according to the comparative embodiment is equivalent to the operation of the semiconductor storage device 1 according to the first embodiment.

On the other hand, the degree (rate, or slope) of decrease in the potential of the node SEN_a when the selected memory cell transistor MT_a is in the OFF state is as follows.

In the same manner as described with reference to FIGS. 9 and 10, a parasitic capacitance is generated between the contact plug CS according to the node SEN_a and the contact plug CS according to the node SEN_b of the sense amplifier unit SAU_b provided adjacent to the sense amplifier unit SAU_a in the second direction. Due to this parasitic capacitance, the potential of the node SEN_a is coupled to the potential of the node SEN_b, and the potential of the node SEN_a may unintentionally change in accordance with a change in the potential of the node SEN_b. Therefore, it is desirable that the potential of the node SEN_b is kept constant during a sense period of the node SEN_a.

However, since the control signals XXL and SPC are also supplied to the sense amplifier unit SAU_b, the potential of the node SEN_b also starts to decrease at time t11. Specifically, the potential of the node SEN_b hardly decreases when the selected memory cell transistor MT_b connected to the node SEN_b is in the OFF state, but greatly decreases when the selected memory cell transistor MT_b is in the ON state.

Therefore, due to the influence of the coupling, the potential of the node SEN_a may decrease in accordance with a decrease in the potential of the node SEN_b. The degree (rate, or slope) of decrease in the potential of the node SEN_a is larger when the selected memory cell transistor MT_b is in the ON state and the potential of the node SEN_b is greatly decreased than when the selected memory cell transistor MT_b is in the OFF state. Accordingly, the potential difference $\Delta V$ of the node SEN_a between when the selected memory cell transistor MT_a is in the ON state and when in the OFF state decreases. FIG. 12 shows the potential of the node SEN_a in this case.

In contrast, in the semiconductor storage device 1 according to the first embodiment, as described with reference to FIGS. 8 and 9, a plurality of groups SAUG are sequentially provided in the second direction D2 such that the group SAUG_n of the sense amplifier units SAU<0> to SAU<15> supplied with the control signals XXL_n, SPC_n, and STB_n, and the group SAUG_m of the sense amplifier units SAU<0> to SAU<15> supplied with the control signals XXL_m, SPC_m, and STB_m are alternately arranged. By using such a control signal, as described with reference to FIG. 11, the sense amplifier unit SAU of the group SAUG_n and the sense amplifier unit SAU of the group SAUG_m execute the read operation at different timings. Here, a parasitic capacitance is generated between the contact plug CS according to the node SEN_n in a certain sense amplifier unit SAU of the group SAUG_n and the contact plug CS according to the node SEN_m in a certain sense amplifier unit SAU of the group SAUG_m as in the case of the comparative embodiment described above.

In such timing control of the read operation, the potential of the node SEN_m can be maintained, for example, when the potential of the node SEN_n decreases. When the potential of the node SEN_m is maintained, the influence of coupling that the node SEN_n receives from the node SEN_m can be kept constant regardless of whether the selected memory cell transistor MT_m is in the ON state or the OFF state. Further, since the potential of the node SEN_m is maintained, a decrease in the potential of the node SEN_n due to the influence of the coupling is prevented. Even when the potential of the node SEN_m decreases, the same control can be performed.

Further, the potential of the node SEN_m in the sense of the node SEN_n and the potential of the node SEN_n in the sense of the node SEN_m can be always set to the same condition (voltage VDD in FIG. 11). Under the same condition, the degree (rate, or slope) of decrease in the potential of the node SEN_n when the selected memory cell transistor MT_n is in the OFF state and the degree (rate, or slope) of decrease in the potential of the node SEN_m when the selected memory cell transistor MT_m is in the OFF state are constant.

Therefore, the potential difference $\Delta V$ of the node SEN_n between when the selected memory cell transistor MT_n is in the ON state and when in the OFF state, and the potential difference $\Delta V$ of the node SEN_m between when the selected memory cell transistor MT_m is in the ON state and when in the OFF state can be made larger than that in the comparative embodiment described above, and $\Delta V$ can be kept substantially constant in any read operation.

Thus, in the semiconductor storage device 1 according to the first embodiment, the decrease in a sense margin corresponding to the potential difference $\Delta V$ can be prevented, and the sense margin can be made substantially constant regardless of the read data. Therefore, according to the semiconductor storage device 1, for example, data sensing can be performed more accurately. Further, when the decrease in the sense margin is prevented, it is possible to secure a sufficient sense margin for performing data sensing even if the charging time of the bit line accompanying the read operation is shortened. In general, the more the charging time of the bit line is shortened, the faster the speed of the read operation. Therefore, according to the semiconductor storage device 1, it is possible to increase the speed of the read operation by shortening the charging time of the bit line in this manner.

Other Embodiments

In the first embodiment, the example in which the common control signals XXL, SPC, and STB are supplied to the sense amplifier units SAU<0> to SAU<15> sequentially adjacent to each other along the first direction has been described. However, the common control signals XXL, SPC, and STB are not necessarily supplied to the sense amplifier units SAU<0> to SAU<15>.

In the first embodiment described above, the notation "same", "coincident", or "constant" may cover a tolerance error. In addition, even the notation "maintenance" may cover the tolerance error.

In addition, when it is described that a certain voltage is applied or supplied, it includes both performing control such that the voltage is applied or supplied, and actually applying or supplying the voltage. In addition, applying or supplying a certain voltage may include applying or supplying a voltage of, for example, 0V.

In the present specification, "connection" shows an electrical connection and does not exclude, for example, connection via another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a first memory cell and a second memory cell connected to a first word line;
a first bit line connected to the first memory cell;
a second bit line connected to the second memory cell; and
a control circuit including a first node, a second node, a first transistor, and a second transistor,
wherein the second transistor is provided adjacent to the first transistor, and
wherein the control circuit is configured to:
electrically connect the first node to the first bit line by setting the first transistor in an ON state while setting the second transistor in an OFF state and sense the first node, and electrically connect the second node to the second bit line by setting the second transistor in the ON state while setting the first transistor in the OFF state and sense the second node.

2. The semiconductor storage device according to claim 1, wherein
the control circuit is configured to set the first transistor in the ON state while maintaining a potential of the second node, and to set the second transistor in the ON state while maintaining a potential of the first node.

3. The semiconductor storage device according to claim 1, wherein
the control circuit is configured to set the first transistor in the ON state while supplying a first voltage to the second node, and to set the second transistor in the ON state while supplying the first voltage to the first node.

4. The semiconductor storage device according to claim 3, wherein
the control circuit is configured to set the first transistor in the ON state after charging the first node to the first voltage, and to set the second transistor in the ON state after charging the second node to the first voltage.

5. The semiconductor storage device according to claim 1, wherein
the control circuit includes: a third transistor including a first end electrically connected to the first node and a second end supplied with a first voltage; and
a fourth transistor including a first end electrically connected to the second node and a second end supplied with the first voltage, and
wherein the control circuit is further configured to set the first transistor in the ON state while setting the third transistor in the OFF state and the fourth transistor in the ON state, and set the second transistor in the ON state while setting the fourth transistor in the OFF state and the third transistor in the ON state.

6. The semiconductor storage device according to claim 1, wherein
the control circuit is configured to sense the first node and the second node at different timings.

7. The semiconductor storage device according to claim 1, wherein
an active area in which the first transistor is provided and an active area in which the second transistor is provided are separated from each other by an interval.

8. The semiconductor storage device according to claim 1, further comprising:
a third memory cell connected to the first word line; and
a third bit line connected to the third memory cell, wherein
the control circuit further comprising a fifth transistor configured to electrically connect the third bit line to a third node,
the fifth transistor is provided adjacent to the first transistor, and
the control circuit is further configured to electrically connect the third node to the third bit line by setting the fifth transistor in the ON state while setting the first transistor in the OFF state and to sense the third node.

9. The semiconductor storage device according to claim 8, wherein
the fifth transistor, the first transistor, and the second transistor are sequentially adjacent to each other in an order of the fifth transistor, the first transistor, and the second transistor along a first direction.

10. A semiconductor storage device, comprising:
a first memory cell and a second memory cell connected to a first word line;
a first bit line connected to the first memory cell;
a second bit line connected to the second memory cell;
a first sense amplifier connected to the first bit line and including a first node, the first sense amplifier configured to sense the first node after the first node is electrically connected to the first bit line;
a second sense amplifier connected to the second bit line and including a second node, the second sense amplifier configured to sense the second node after the second node is electrically connected to the second bit line; and
a control circuit configured to electrically connect the first node to the first bit line concurrently with maintaining a potential of the second node by a second voltage and subsequently to charging the first node to a first voltage, and to electrically connect the second node to the second bit line concurrently with maintaining a potential of the first node by the second voltage and subsequent to charging the second node to the first voltage.

11. The semiconductor storage device according to claim 10, wherein
a magnitude of the first voltage is equal to a magnitude of the second voltage.

12. A method, comprising:
selecting a word line connected to a first memory cell and second memory cell, the first memory cell and second memory cell connected to a first bit line and a second bit line, respectively;
electrically connect a first node of a first sense amplifier to the first bit line while electrically disconnecting a second node of a second sense amplifier from the second bit line to read data stored in the first memory cell via a potential of the first node; and
electrically connect the second node of the second sense amplifier to the second bit line while electrically disconnecting the first node of the first sense amplifier from the first bit line to read data stored in the second memory cell via a potential of the second node.

13. The method of claim 12, further comprising:
transitioning a first transistor of the first sense amplifier to an ON state to electrically connect the first node to the first bit line while remaining a second transistor of the second sense amplifier in an OFF state.

14. The method of claim 12, further comprising:
transitioning a second transistor of the second sense amplifier to an ON state to electrically connect the second node to the second bit line while remaining a first transistor of the first sense amplifier in an OFF state.

* * * * *